(12) United States Patent  (10) Patent No.: US 8,956,914 B2
Yun et al.  (45) Date of Patent: Feb. 17, 2015

(54) INTEGRATED CIRCUIT PACKAGE SYSTEM WITH OVERHANG DIE

(75) Inventors: Ja Eun Yun, Busan (KR); Jong Wook Ju, Bubal-eub Icheon-Si (KR)

(73) Assignee: STATS ChipPAC Ltd., Singapore (SG)

( * ) Notice: Subject to any disclaimer, the term of this patent is extended or adjusted under 35 U.S.C. 154(b) by 902 days.

(21) Appl. No.: 11/768,790

(22) Filed: Jun. 26, 2007

(65) Prior Publication Data
US 2009/0001613 A1  Jan. 1, 2009

(51) Int. Cl.
*H01L 21/00* (2006.01)
*H01L 23/31* (2006.01)
*H01L 23/16* (2006.01)
*H01L 23/00* (2006.01)
*H01L 25/065* (2006.01)

(52) U.S. Cl.
CPC ............ *H01L 23/3121* (2013.01); *H01L 23/16* (2013.01); *H01L 24/29* (2013.01); *H01L 24/32* (2013.01); *H01L 24/48* (2013.01); *H01L 24/49* (2013.01); *H01L 24/73* (2013.01); *H01L 24/83* (2013.01); *H01L 25/0657* (2013.01); *H01L 2224/05553* (2013.01); *H01L 2224/2919* (2013.01); *H01L 2224/32057* (2013.01); *H01L 2224/32145* (2013.01); *H01L 2224/32225* (2013.01); *H01L 2224/45014* (2013.01); *H01L 2224/48091* (2013.01); *H01L 2224/48227* (2013.01); *H01L 2224/48465* (2013.01); *H01L 2224/4899* (2013.01); *H01L 2224/49171* (2013.01); *H01L 2224/49175* (2013.01); *H01L 2224/73265* (2013.01); *H01L 2224/83101* (2013.01); *H01L 2224/83191* (2013.01); *H01L 2224/83385* (2013.01); *H01L 2224/83856* (2013.01); *H01L 2225/0651* (2013.01); *H01L 2225/06562* (2013.01); *H01L 2225/06575* (2013.01); *H01L 2924/01005* (2013.01); *H01L 2924/01014* (2013.01); *H01L 2924/01082* (2013.01); *H01L 2924/014* (2013.01); *H01L 2924/07802* (2013.01); *H01L 2924/14* (2013.01); *H01L 2924/15311* (2013.01); *H01L 2924/01033* (2013.01); *H01L 2924/0665* (2013.01); *H01L 2224/29101* (2013.01)
USPC ........... 438/106; 438/108; 438/109; 438/121; 438/126; 438/127; 438/15; 438/25; 438/26; 438/51; 438/64; 257/684; 257/686; 257/777; 257/782; 257/784; 257/E23.026

(58) Field of Classification Search
USPC .......... 257/684, 686, 777, E23.006, E23.023, 257/787
See application file for complete search history.

(56) References Cited

U.S. PATENT DOCUMENTS

| | | | |
|---|---|---|---|
| 6,340,846 B1 | 1/2002 | LoBianco et al. | |
| 6,445,075 B1 * | 9/2002 | Scanlan et al. | 257/778 |
| 6,506,633 B1 * | 1/2003 | Cheng et al. | 438/126 |
| 6,818,978 B1 * | 11/2004 | Fan | 257/686 |
| 7,116,002 B2 | 10/2006 | Chao et al. | |
| 7,132,753 B1 | 11/2006 | St. Amand et al. | |
| 7,161,249 B2 * | 1/2007 | Shim et al. | 257/777 |
| 2004/0212096 A1 * | 10/2004 | Wang | 257/777 |
| 2006/0267609 A1 | 11/2006 | Lee et al. | |
| 2007/0001296 A1 | 1/2007 | Lee et al. | |
| 2007/0132093 A1 * | 6/2007 | Chuang et al. | 257/723 |

* cited by examiner

*Primary Examiner* — Steven Loke
*Assistant Examiner* — Cuong B Nguyen
(74) *Attorney, Agent, or Firm* — Ishimaru & Associates LLP

(57) ABSTRACT

An integrated circuit package system comprising: forming a substrate having a solder mask with a support structure formed from the solder mask; mounting a first integrated circuit device over the support structure; connecting the substrate and the first integrated circuit device; and encapsulating the first integrated circuit device and the support structure.

16 Claims, 3 Drawing Sheets

INTEGRATED CIRCUIT PACKAGE SYSTEM WITH OVERHANG DIE

TECHNICAL FIELD

The present invention relates generally to an integrated circuit package system, and more particularly to an integrated circuit package system with multiple integrated circuits.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit and an integrated circuit package, they do not fully address the requirements for lower height, smaller space, and cost reduction.

Modern electronics, such as smart phones, personal digital assistants, location based services devices, servers, and storage arrays, are packing more integrated circuits into an ever-shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever-demanding integration of today's integrated circuits and packages.

Numerous package approaches stack multiple integrated circuit dice or package in package (PIP) or a combination thereof. The electrical connections to the each of the stacked integrated circuit require space typically formed by spacers, such as silicon spacers or interposers. Current spacers require additional steps and structures increasing manufacturing costs and decreasing manufacturing yields. These spacers also limit the amount of height reduction for the integrated circuit package.

As a further example, stacking multiple integrated circuits with overhangs causes additional problems. If wire bonding is performed to the overhang portion of the integrated circuit, the integrated circuit may be damaged. Conventional solutions provide separate support structures underneath the overhang to compensate for the wire bonding downward force and to mitigate or eliminate damage to the integrated circuits. These separate support structures require additional manufacturing steps and alignment factors resulting in a more complex and costly manufacturing process and end product.

In addition to the spacers, stacked integrated circuit dice or stacked packaged integrated circuit offer suffer inadvertent shorting of the bond wires. The input/output (I/O) density and package profile requirements drive the bond pads and the bond wires closer and closer. As bond wires get closer, they become more susceptible to wire loop sweeps during molding process resulting in inadvertently shorting.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

An integrated circuit package system comprising: forming a substrate having a solder mask with a support structure formed from the solder mask; mounting a first integrated circuit device over the support structure; connecting the substrate and the first integrated circuit device; and encapsulating the first integrated circuit device and the support structure.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
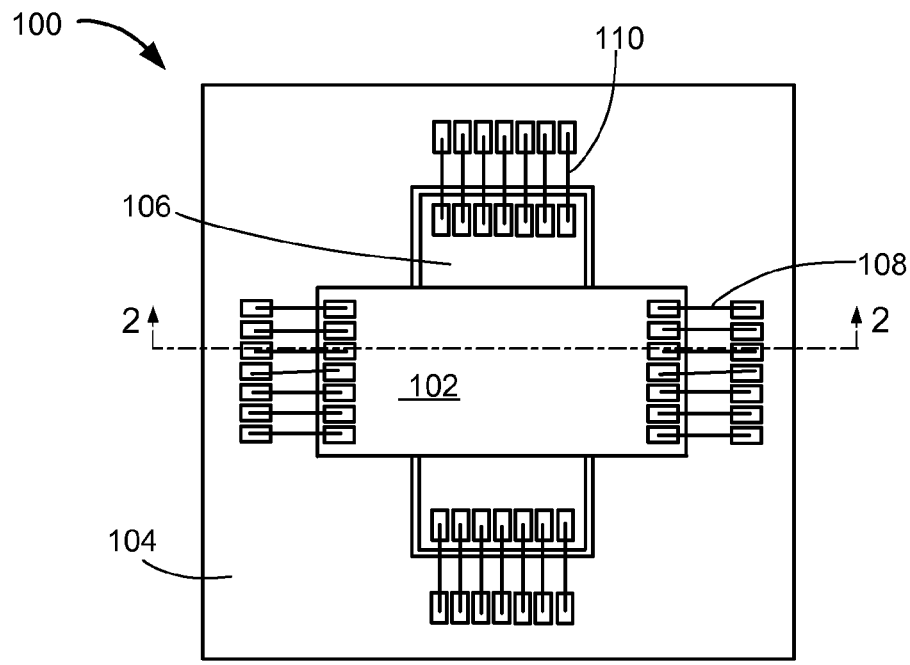
FIG. 1 is a plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a plan view of an integrated circuit package system 100 in a first embodiment of the present invention. The plan view depicts the integrated circuit package system 100 without a cover. The integrated circuit package system 100 preferably has a first integrated circuit device 102, such as an integrated circuit die, over a substrate 104, such as a laminate substrate. A second integrated circuit device 106, such as an integrated circuit die, is preferably over the first integrated circuit device 102 in an intersecting orientation, such as a perpendicular orientation. The perpendicular orientation preferably has the second integrated circuit device 106 partially exposing the first integrated circuit device 102.

First internal interconnects 108, such as bond wires or ribbon bond wires, preferably connect the first integrated circuit device 102 and the substrate 104. Second internal interconnects 110, such as bond wires or ribbon bond wires, preferably connect the second integrated circuit device 106 and the substrate 104.

For illustrative purposes, the first integrated circuit device 102 and the second integrated circuit device 106 are shown as substantially the same size, although it is understood that the first integrated circuit device 102 and the second integrated circuit device 106 may be different sizes. Also for illustrative purposes, the integrated circuit package system 100 is shown having the substrate 104 as a laminated substrate, although it is understood that the substrate 104 may be of a different type. For example, the substrate 104 may be formed from a lead frame (not shown) having leads (not shown) and a die-attach paddle (not shown).

Figure 2:
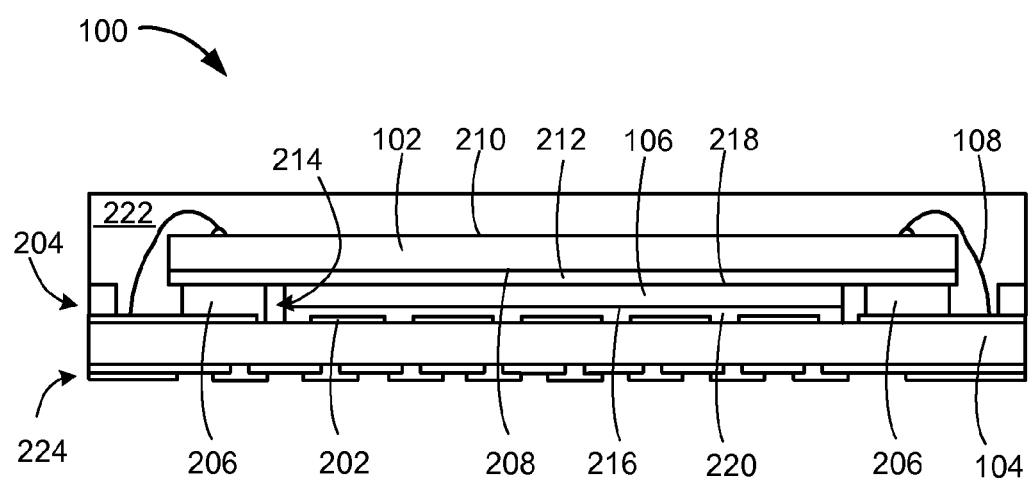
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the substrate 104 having traces 202 and a first solder mask 204. The first solder mask 204 provides support structures 206 for the first integrated circuit device 102, such that the support structures 206 are integral to the first solder mask 204. The first integrated circuit device 102 has a first non-active side 208 and a first active side 210 with the first non-active side 208 mounted over and facing the support structures 206, preferably with a first adhesive 212, such as a die-attach adhesive, a B-staged epoxy, a backside concealer, or an adhesive film, attached between the first non-active side 208 and the support structures 206. The first active side 210 includes active circuitry fabricated thereon and preferably faces away from the substrate 104. The first internal interconnects 108 connect the first active side 210 and a predetermined selection of the traces 202 exposed by the first solder mask 204 of the substrate 104.

For illustrative purposes, the first integrated circuit device 102 mounts over more than one of the support structures 206, although it is understood that the first integrated circuit device 102 may mount over one of the support structures 206. For example, the first integrated circuit device 102 may mount over one of the support structures 206 such that the first non-active side 208 extends beyond the horizontal dimension of the one of the support structures 206 but not extend beyond the horizontal dimension of the substrate 104.

The second integrated circuit device 106 is preferably mounted adjacent to the support structures 206, within a cavity 214 formed between the support structures 206. The second integrated circuit device 106 includes a second non-active side 216 and a second active side 218, wherein the second active side 218 has active circuitry fabricated thereon. Preferably, the second integrated circuit device 106 has a second adhesive 220 attached to the second non-active side 216 and is mounted over the substrate 104 with the second non-active side 216 facing the substrate 104. The second integrated circuit device 106 is preferably mounted in an intersecting orientation, such as a perpendicular orientation, to the first integrated circuit device 102 and below the first integrated circuit device 102.

A package encapsulation 222, such as an epoxy molding compound, covers the first integrated circuit device 102, the second integrated circuit device 106, and the support structures 206, the first internal interconnects 108, and the second internal interconnects 110 of FIG. 1. Preferably, a second solder mask 224 of the substrate 104 may be provided at an opposing side to the first solder mask 204, the second solder mask 224 preferably expose the traces 202 for attaching to next system level (not shown), such as a printed circuit board or another integrated circuit package system, with external interconnects (not shown), such as solder balls, attach under the substrate 104.

Although the substrate 104 is shown as a two-metal layer substrate, it is understood that the number of metal layers of the substrate 104 may vary, as are the placements and number of the traces in the substrate 104. It is further understood that the second integrated circuit device 106 may also be mounted instead with the second active side 218 facing the substrate 104, such as a flip chip.

It has been discovered that the present invention improves yield, lowers cost, and provides a lower package height by reducing or eliminating die bouncing, bending, or cracking with the support structures 206 and by mounting the second integrated circuit device 106 within the cavity 214 between the support structures 206 and below the first integrated circuit device 102. Yet another benefit of this invention is the easy integration of forming the support structures 206 by only patterning the solder mask 204 of the substrate 104 to extend under the dimension of the first integrated circuit device 102, while providing the cavity 214 for the second integrated circuit device 106, in the manufacturing steps of the integrated circuit package system.

Figure 3:
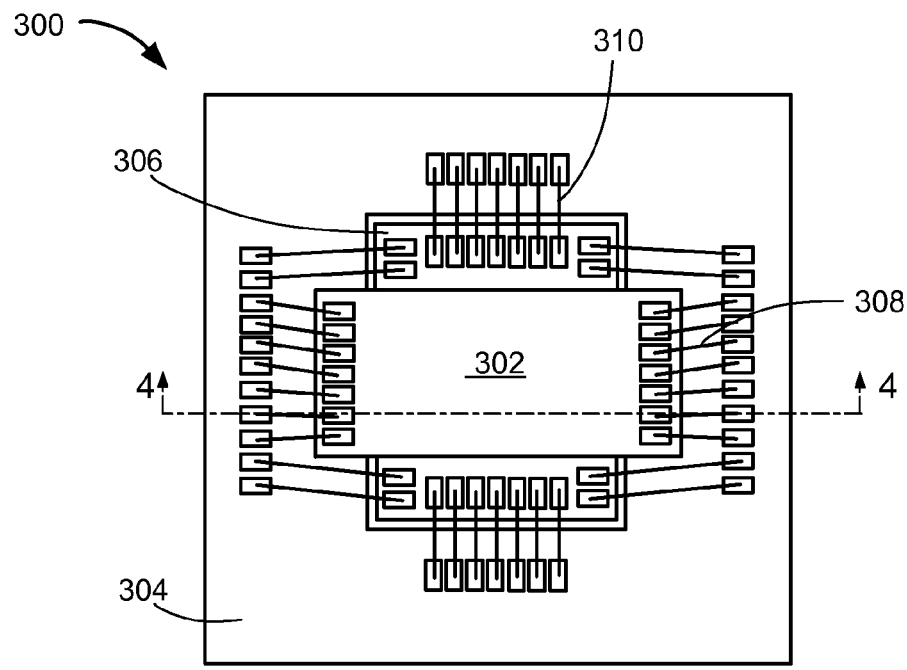
FIG. 3 is a plan view of an integrated circuit package system in a second embodiment of the present invention.

Referring now to FIG. 3 therein is shown a plan view of an integrated circuit package system 300 in a second embodiment of the present invention. The plan view depicts the integrated circuit package system 300 without a cover. The integrated circuit package system 300 preferably has a first integrated circuit device 302, such as an integrated circuit die, over a substrate 304, such as a laminate substrate. A second integrated circuit device 306, such as an integrated circuit die, is preferably over the first integrated circuit device 302 in an intersecting orientation, such as a perpendicular orientation. The perpendicular orientation preferably has the second integrated circuit device 306 partially exposing the first integrated circuit device 302.

First internal interconnects 308, such as bond wires or ribbon bond wires, preferably connect the first integrated circuit device 302 and the substrate 304. Second internal interconnects 310, such as bond wires or ribbon bond wires, preferably connect the second integrated circuit device 306 and the substrate 304.

For illustrative purposes, the first integrated circuit device 302 and the second integrated circuit device 306 are shown as substantially the same size, although it is understood that the first integrated circuit device 302 and the second integrated circuit device 306 may be different sizes. Also for illustrative purposes, the integrated circuit package system 300 is shown having the substrate 304 as a laminated substrate, although it is understood that the substrate 304 may be of a different type. For example, the substrate 304 may be formed from a lead frame (not shown) having leads (not shown) and a die-attach paddle (not shown).

Figure 4:
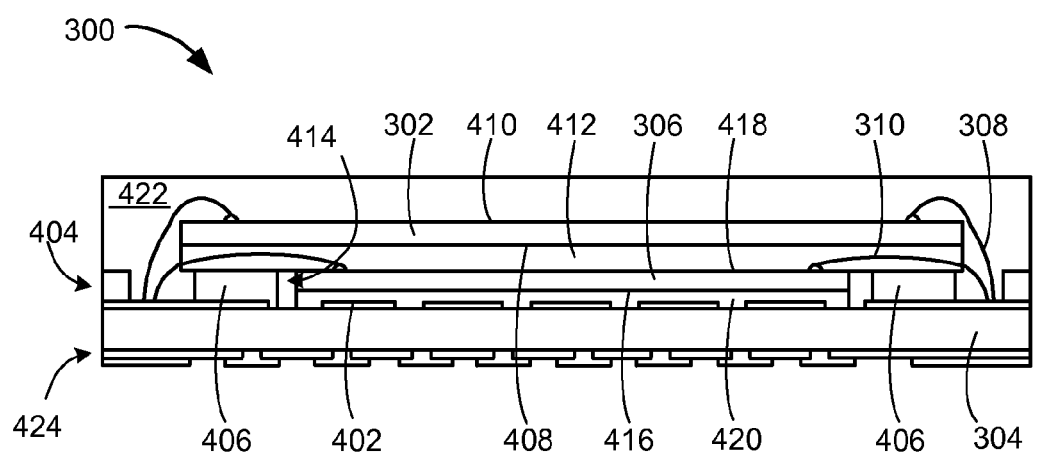
FIG. 4 is a cross-sectional view of the integrated circuit package system along line 4-4 of FIG. 3.

Referring now to FIG. 4, therein is shown a cross-sectional view of the integrated circuit package system 300 along line 4-4 of FIG. 3. The cross-sectional view depicts the substrate 304 having traces 402 and a first solder mask 404. The first solder mask 404 provides support structures 406 for the first integrated circuit device 302 such that the support structures 406 are integral to the first solder mask 404. The first integrated circuit device 302 has a first non-active side 408 and a first active side 410 with the first non-active side 408 mounted over and facing the support structures 406, preferably with a first adhesive 412, such as a die-attach adhesive, a B-staged epoxy, a backside concealer, or an adhesive film. The first active side 410 includes active circuitry fabricated thereon and faces away from the substrate 304. The first internal interconnects 308 connect the first active side 410 and a predetermined selection of the traces 402 exposed by the first solder mask 404 of the substrate 304.

For illustrative purposes, the first integrated circuit device 302 mounts over more than one of the support structures 406, although it is understood that the first integrated circuit device 302 may mount over one of the support structures 406. For example, the first integrated circuit device 302 may mount over one of the support structures 406 such that the first non-active side 408 extends beyond the horizontal dimension of the one of the support structures 406 but not extend beyond the horizontal dimension of the substrate 304.

The second integrated circuit device 306 is preferably mounted adjacent to the support structures 406, within a cavity 414 formed between the support structures 406. The second integrated circuit device 306 includes a second non-active side 416 and a second active side 418, wherein the second active side 418 has active circuitry fabricated thereon. Preferably, the second integrated circuit device 306 has a second adhesive 420 attached to the second non-active side 416 and is mounted over the substrate 304 with the second non-active side 416 facing the substrate 304. The second integrated circuit device 306 is preferably mounted in an intersecting orientation, such as a perpendicular orientation, to the first integrated circuit device 302 and below the first integrated circuit device 302.

The second internal interconnects 310 electrically connect the second active side 418 and the traces 402 in the substrate 304. The second adhesive 420 preferably has a thickness for covering the second internal interconnects 310 and to avoid breakage and shorts.

A package encapsulation 422, such as an epoxy molding compound, covers the first integrated circuit device 302, the second integrated circuit device 306, the support structures 406, the first internal interconnects 308, and the second internal interconnects 310. Preferably, a second solder mask 424 of the substrate 304 may be provided at an opposing side to the first solder mask 404, the second solder mask 424 preferably exposes the traces 402 for attaching to next system level (not shown), such as a printed circuit board or another integrated circuit package system, with external interconnects (not shown), such as solder balls, attach under the substrate 304.

Although the substrate 304 is shown as a two-metal layer substrate, it is understood that the number of metal layers of the substrate 304 may vary, as are the placements and number of the traces 402 in the substrate 304. It is further understood that the second integrated circuit device 306 may also be mounted instead with the second active side 418 facing the substrate 304.

It has been discovered that the present invention provides high density input/output (I/O) density for the integrated circuit package system while improving yield, lowering cost, and providing a lower package height. The adhesive functions as a spacer providing clearance for the bond wire connections the lower integrated circuit device.

Figure 5:
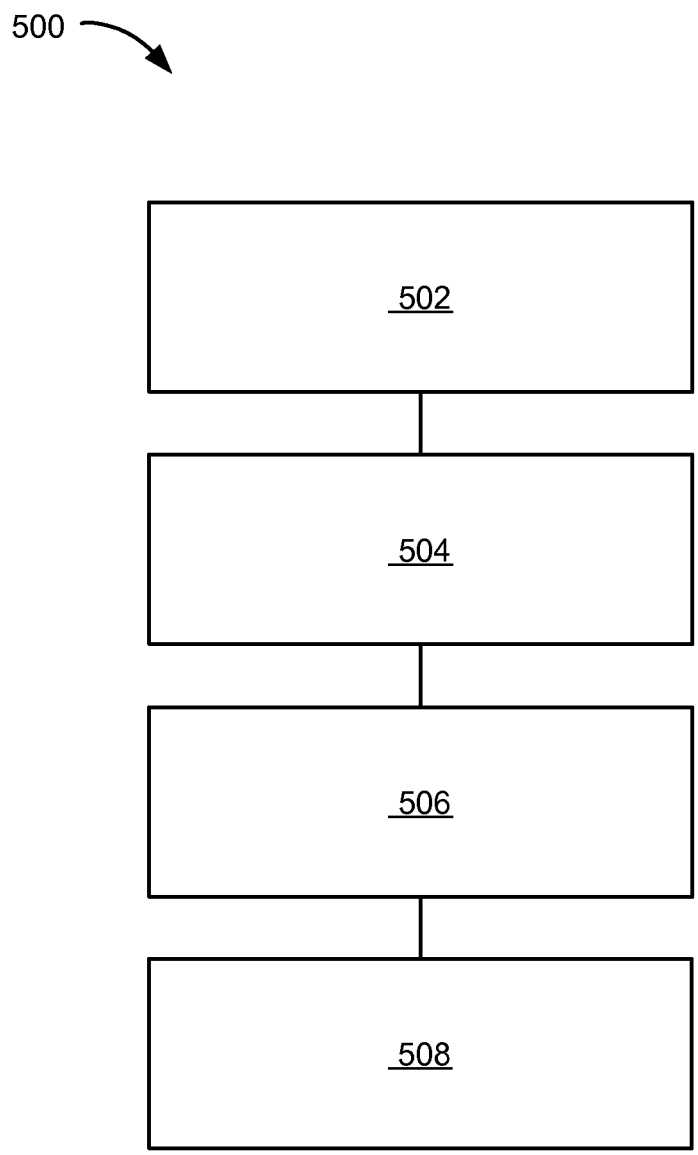
FIG. 5 is a flow chart of an integrated package system for manufacturing the integrated circuit package system in an embodiment of the present invention.

Referring now to FIG. 5, therein is a flow chart of an integrated circuit package system 500 for manufacturing the integrated circuit package system 100 in an embodiment of the present invention. The system 500 includes forming a substrate having a solder mask with a support structure formed from the solder mask in a block 502; mounting a first integrated circuit device over the support structure in a block 504; connecting the substrate and the first integrated circuit device in a block 506; and encapsulating the first integrated circuit device and the support structure in a block 508.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
   forming a substrate having a solder mask with a support structure formed by only patterning the solder mask;
   attaching a first integrated circuit device to the support structure;
   connecting the substrate and the first integrated circuit device; and
   encapsulating the first integrated circuit device and the support structure.

2. The method as claimed in claim 1 wherein mounting the second integrated circuit device includes mounting the second integrated circuit device adjacent to the support structure.

3. The method as claimed in claim 1 wherein mounting the second integrated circuit device within the cavity includes mounting the second integrated circuit device below the first integrated circuit device.

4. The method as claimed in claim 1 further comprising connecting the second integrated circuit device to the substrate.

5. A method of manufacturing an integrated circuit package system comprising: forming a substrate having a solder mask with a support structure and a further support structure formed by only patterning the solder mask including etching the solder mask for forming the support structure and the further support structure; attaching a first integrated circuit device, having a first non-active side and a first active side, to the support structure with the first non-active side facing the support structure; mounting a second integrated circuit device, having a second non-active side with a first adhesive thereon, within a cavity between the support structure and the further support structure, and the first adhesive facing the substrate; connecting a trace in the substrate exposed by the support structure and the first active side; and encapsulating the first integrated circuit device, a first internal interconnect, the support structure, and the further support structure.

6. The method as claimed in claim 5 further comprising attaching a second adhesive to the first non-active side.

7. The method as claimed in claim 5 further comprising:
attaching a second adhesive to the first non-active side;
mounting the second integrated circuit device adjacent to the support structure; and
wherein attaching the first integrated circuit device over the support structure includes:
mounting the first integrated circuit device over the second integrated circuit device with the second adhesive facing the second integrated circuit device.

8. The method as claimed in claim 5 further comprising: attaching a second adhesive to the first non-active side; connecting an internal interconnect over the support structure between the second integrated circuit device and the substrate; and wherein attaching the first integrated circuit device to the support structure includes: mounting the first integrated circuit device over the second integrated circuit device with the internal interconnect in the second adhesive.

9. An integrated circuit package system comprising: a substrate having a solder mask with a support structure and a further support structure patterned from the solder mask; a first integrated circuit device attached to the support structure, the first integrated circuit device, includes a first non-active side and a first active side with the first non-active side facing the support structure, connected to the substrate; a second integrated circuit device, having a second non-active side with a first adhesive thereon and a second active side, within a cavity between the support structure and the further support structure, and the first adhesive facing the substrate; and a package encapsulation over the first integrated circuit device, the support structure, and the further support structure.

10. The system as claimed in claim 9 wherein the second integrated circuit device adjacent to the support structure.

11. The system as claimed in claim 9 wherein the second integrated circuit device within the cavity includes the second integrated circuit device below the first integrated circuit device.

12. The system as claimed in claim 9 wherein the second integrated circuit device adjacent to the support structure and connected to the substrate.

13. The system as claimed in claim 9 further comprising:
a trace in the substrate exposed by the support structure connected to the first active side.

14. The system as claimed in claim 13 further comprising a second adhesive attached to the first non-active side.

15. The system as claimed in claim 13 further comprising:
a second adhesive attached to the first non-active side; and
wherein the first integrated circuit device attached to the support structure includes: the first integrated circuit device over the second integrated circuit device with the second adhesive facing the second integrated circuit device.

16. The system as claimed in claim 13 further comprising: a second adhesive attached to the first non-active side; an internal interconnect over the support structure between the second integrated circuit device and the substrate; and wherein the first integrated circuit device attached to the support structure includes: the first integrated circuit device over the second integrated circuit device with the internal interconnect in the second adhesive.

* * * * *

UNITED STATES PATENT AND TRADEMARK OFFICE
CERTIFICATE OF CORRECTION

PATENT NO. : 8,956,914 B2  Page 1 of 1
APPLICATION NO. : 11/768790
DATED : February 17, 2015
INVENTOR(S) : Yun et al.

It is certified that error appears in the above-identified patent and that said Letters Patent is hereby corrected as shown below:

In the Claims:

Column 6, lines 55-64, delete:

"A method of manufacturing an integrated circuit package system comprising: forming a substrate having a solder mask with a support structure formed by only patterning the solder mask; attaching a first integrated circuit device to the support structure; connecting the substrate and the first integrated circuit device; and encapsulating the first integrated circuit device and the support structure."

And insert therefor:

--A method of manufacturing an integrated circuit package system comprising:
forming a substrate having a solder mask with a support structure and a further support structure formed by only patterning the solder mask including etching the solder mask for forming the support structure and the further support structure;
attaching a first integrated circuit device to the support structure and the further support structure;
mounting a second integrated circuit device, having a non-active side with an adhesive thereon, within a cavity between the support structure and the further support structure, and the adhesive facing the substrate;
connecting the substrate and the first integrated circuit device; and
encapsulating the first integrated circuit device, the support structure, and the further support structure.--

Signed and Sealed this
Nineteenth Day of April, 2016

Michelle K. Lee
*Director of the United States Patent and Trademark Office*